(12) United States Patent
Wang (10) Patent No.: US 11,714,126 B2
(45) Date of Patent: Aug. 1, 2023

(54) DETECTION CIRCUIT FOR DETECTING THE AMPLITUDE OF A CLOCK SIGNAL AND DETECTION METHOD THEREOF

(71) Applicant: Nuvoton Technology Corporation, Hsinchu (TW)

(72) Inventor: Cheng-Chih Wang, Jhubei City (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days.

(21) Appl. No.: 17/583,668

(22) Filed: Jan. 25, 2022

(65) Prior Publication Data
US 2023/0107070 A1  Apr. 6, 2023

(30) Foreign Application Priority Data
Oct. 6, 2021 (TW) ................... 110137140

(51) Int. Cl.
| | |
|---|---|
| *G01R 31/317* | (2006.01) |
| *H03K 5/24* | (2006.01) |
| *H03B 5/32* | (2006.01) |
| *G06F 1/04* | (2006.01) |
| *H03F 3/04* | (2006.01) |
| *H03K 5/00* | (2006.01) |
| *H03G 3/30* | (2006.01) |

(52) U.S. Cl.
CPC ........... *G01R 31/31727* (2013.01); *G06F 1/04* (2013.01); *H03B 5/32* (2013.01); *H03F 3/04* (2013.01); *H03K 5/24* (2013.01); *H03G 3/30* (2013.01); *H03G 3/3089* (2013.01); *H03K 2005/00078* (2013.01)

(58) Field of Classification Search
CPC ..... H03B 5/00; H03B 5/32; H03L 5/00; H03G 3/3089; H03G 3/30; H03K 5/24; G01R 31/31727; G06F 1/04; H03F 3/04
USPC .................................. 331/158, 116 FE, 175
See application file for complete search history.

(56) References Cited

U.S. PATENT DOCUMENTS

| | | | |
|---|---|---|---|
| 6,819,196 B2 | 11/2004 | Lovelace et al. | |
| 7,902,933 B1 | 3/2011 | Brennan | |
| 8,816,786 B2* | 8/2014 | Tham | H03B 5/06 331/109 |
| 8,952,762 B2 | 2/2015 | O'Sullivan | |
| 9,401,724 B1 | 7/2016 | Gao et al. | |
| 2014/0266487 A1* | 9/2014 | Vaishnav | H03K 5/082 331/183 |

FOREIGN PATENT DOCUMENTS

TW            201817157 A        5/2018

* cited by examiner

*Primary Examiner* — Arnold M Kinkead
(74) *Attorney, Agent, or Firm* — Muncy, Geissler, Olds & Lowe, P.C.

(57) ABSTRACT

A detection circuit for detecting a clock signal includes a multiplexer, a digital-to-analog converter, a comparator, and a counter. The multiplexer outputs either a first signal or a second signal as a selection signal. The digital-to-analog converter outputs a reference voltage according to the selection signal. The comparator compares the clock signal to the reference voltage to generate a comparison signal. The counter counts a reference clock signal to generate an overflow signal, and resets the overflow signal according to the comparison signal. The overflow signal indicates the amplitude of the clock signal.

20 Claims, 7 Drawing Sheets

DETECTION CIRCUIT FOR DETECTING THE AMPLITUDE OF A CLOCK SIGNAL AND DETECTION METHOD THEREOF

CROSS REFERENCE TO RELATED APPLICATIONS

This Application claims priority of Taiwan Patent Application No. 110137140, filed on Oct. 6, 2021, the entirety of which is incorporated by reference herein.

BACKGROUND OF THE INVENTION

Field of the Invention

The disclosure is generally related to a detection circuit, an electronic circuit, and a detection method thereof, and more particularly it is related to a detection circuit, an electronic circuit, and a detection method for detecting the amplitude of a clock signal.

Description of the Related Art

The normal operation of the crystal oscillator is often very critical to a micro-controller. The quartz crystal oscillator sometimes undergoes qualitative changes due to environmental changes, the crystal, or the circuit itself, resulting in the entire quartz crystal working abnormally, which could lead to the whole micro-controller not working properly, or at all. Therefore, it is necessary to detect the amplitude of the clock signal generated by the quartz crystal oscillator to ensure that the microprocessor is able to work normally.

BRIEF SUMMARY OF THE INVENTION

The invention proposes a detection circuit for detecting the peak-to-peak amplitude of the clock signal, which is configured to detect whether the peak-to-peak amplitude of the clock signal is large enough. The invention further provides an electronic circuit and a detection method for detecting whether the peak-to-peak amplitude of the clock signal is sufficiently large. When it is determined that the peak-to-peak amplitude of the clock signal is not large enough, the gain of the amplifier of the oscillation circuit is increased to increase the peak-to-peak amplitude of the clock signal. The invention further issues a warning according to the gain of the amplifier of the oscillation circuit to inform the user that the quartz crystal should be replaced as soon as possible to maintain the normal operation of the system.

In an embodiment, a detection circuit for detecting a clock signal comprises a multiplexer, a digital-to-analog converter, a comparator, and a counter. The multiplexer outputs either a first signal or a second signal as a selection signal according to a comparison signal. The digital-to-analog converter outputs a reference voltage according to the selection signal. The comparator compares the clock signal to the reference voltage to generate the comparison signal. The counter counts a number of pulses of a reference clock signal to generate an overflow signal and resets the overflow signal according to the comparison signal. The overflow signal indicates amplitude of the clock signal.

According to an embodiment of the invention, the digital-to-analog converter receives an external voltage and the digital-to-analog converter generates a first reference voltage according to the first signal and the external voltage. The digital-to-analog converter generates a second reference voltage according to the second signal and the external voltage. The first reference voltage is lower than the second reference voltage.

According to an embodiment of the invention, when peak-to-peak amplitude of the clock signal is outside the range of the first reference voltage and the second reference voltage, the comparison signal is switched between a first voltage level and a second voltage level, and the counter periodically resets the overflow signal according to the comparison signal.

According to another embodiment of the invention, when the peak-to-peak amplitude of the clock signal is between the first reference voltage and the second reference voltage, the comparison signal is at a second voltage level, and the counter counts the number of pulses of the reference clock signal to generate the overflow signal.

According to an embodiment of the invention, the detection circuit further comprises a delay circuit and an exclusive-OR gate. The delay circuit generates a delay comparison signal according to the comparison signal and a delay time. The delay comparison signal is delayed by the delay time compared to the comparison signal. The exclusive-OR gate comprises a first logic input terminal, a second logic input terminal, and a logic output terminal. The first logic input terminal receives the comparison signal, the second logic input terminal receives the delay comparison signal, and the logic output terminal generates a reset signal. The counter resets the overflow signal based on the reset signal.

According to an embodiment of the invention, when the comparison signal is converted from a first voltage level to a second voltage level or from the second voltage level to the first voltage level, the reset signal generated by the exclusive-OR gate resets the overflow signal. When the comparison signal is at the first voltage level or the second voltage level, the reset signal generated by the exclusive-OR gate does not reset the overflow signal.

According to an embodiment of the invention, the comparator comprises a first input terminal, a second input terminal, and an output terminal. The first input terminal receives the input voltage. The second input terminal receives the reference voltage. When the input voltage exceeds the reference voltage, the output terminal outputs a first voltage level to serve as the comparison signal. When the input voltage does not exceed the reference voltage, the output terminal outputs a second voltage level to serve as the comparison signal.

According to an embodiment of the invention, when the output terminal outputs the first voltage level, the multiplexer provides the first signal to the digital-to-analog converter. When the output terminal outputs the second voltage level, the multiplexer provides the second signal to the digital-to-analog converter.

In another embodiment, an electronic circuit comprises a detection circuit, an oscillation circuit, and a controller. The detection circuit comprises a multiplexer, a digital-to-analog converter, a comparator, and a counter. The multiplexer outputs the first signal or the second signal as a selection signal according to a comparison signal. The digital-to-analog converter outputs a reference voltage according to the selection signal. The comparator compares the clock signal to the reference voltage to generate the comparison signal. The counter counts a number of pulses of a reference clock signal to generate an overflow signal and resets the overflow signal according to the comparison signal. The overflow signal indicates amplitude of the clock signal. The oscillation circuit generates the clock signal and comprises an amplifier and a quartz crystal. The amplifier amplifies a signal of a first node with a gain to generate the clock signal at a second node and generates the gain according to a gain signal. The quartz crystal is electrically connected between the first node and the second node. The controller generates the gain signal according to the overflow signal.

According to an embodiment of the invention, when the overflow signal is at a first voltage level, the controller maintains the gain according to the gain signal. When the overflow signal is at a second voltage level, the controller increases the gain according to the gain signal.

According to an embodiment of the invention, the digital-to-analog converter receives an external voltage and the digital-to-analog converter generates a first reference voltage according to the first signal and the external voltage. The digital-to-analog converter generates a second reference voltage according to the second signal and the external voltage, wherein the first reference voltage is lower than the second reference voltage.

According to an embodiment of the invention, when peak-to-peak amplitude of the clock signal is outside the range of the first reference voltage and the second reference voltage, the comparison signal is switched between a first voltage level and a second voltage level, and the counter periodically resets the overflow signal according to the comparison signal. When the peak-to-peak amplitude of the clock signal is within the range of the first reference voltage and the second reference voltage, the comparison signal is at the second voltage level, and the counter counts the number of pulses of the reference clock signal to generate the overflow signal.

According to an embodiment of the invention, the detection circuit further comprises a delay circuit and an exclusive-OR gate. The delay circuit generates a delay comparison signal according to the comparison signal and a delay time. The delay comparison signal is delayed by the delay time compared to the comparison signal. The exclusive-OR gate comprises a first logic input terminal, a second logic input terminal, and a logic output terminal. The first logic input terminal receives the comparison signal, the second logic input terminal receives the delay comparison signal, and the logic output terminal generates a reset signal. The counter resets the overflow signal based on the reset signal.

According to an embodiment of the invention, when the comparison signal is converted from a first voltage level to a second voltage level or from the second voltage level to the first voltage level, the reset signal generated by the exclusive-OR gate resets the overflow signal. When the comparison signal is at the first voltage level or the second voltage level, the reset signal generated by the exclusive-OR gate does not reset the overflow signal.

According to an embodiment of the invention, the comparator comprises a first input terminal, a second input terminal, and an output terminal. The first input terminal receives the input voltage. The second input terminal receives the reference voltage. When the input voltage exceeds the reference voltage, the output terminal outputs a first voltage level to serve as the comparison signal. When the input voltage does not exceed the reference voltage, the output terminal outputs a second voltage level to serve as the comparison signal.

According to an embodiment of the invention, when the output terminal outputs the first voltage level, the multiplexer provides the first signal to the digital-to-analog converter. When the output terminal outputs the second voltage level, the multiplexer provides the second signal to the digital-to-analog converter.

According to an embodiment of the invention, the gain of the amplifier has a maximum gain, wherein when the gain is between a first ratio and a second ratio of the maximum gain, the controller issues a first warning. When the gain exceeds the second ratio of the maximum gain, the controller issues a second warning. When the gain is less than the first ratio of the maximum gain, the controller does not issue the first warning or the second warning. The second ratio exceeds the first ratio. The first warning and the second warning are different.

In yet another embodiment, a detection method for detecting a clock signal generated by an oscillation circuit is provided. The oscillation circuit comprises an amplifier having a gain. The detection method comprises comparing the clock signal to a first reference voltage and a second reference voltage to generate a comparison signal; by using a counter, counting a number of pulses of a reference clock signal to generate an overflow signal; resetting the overflow signal according to the comparison signal; and adjusting the gain according to the overflow signal.

According to an embodiment of the invention, the detection method further comprises when the clock signal oscillates between the first reference voltage and the second reference voltage, counting the number of pulses of the reference clock signal with the counter to generate the overflow signal at a first voltage level; when the clock signal oscillates outside the range of the first reference voltage and the second reference voltage, resetting the overflow signal to be a second voltage level via the comparison signal; when the overflow signal is at the first voltage level, increasing the gain; and when the overflow signal is at the second voltage level, maintaining the gain.

According to an embodiment of the invention, the gain has a maximum gain, wherein the detection method further comprises when the gain is within a first ratio and a second ratio of the maximum gain, issuing a first warning; when the gain exceeds the second ratio of the maximum gain, issuing a second warning; and when the gain is less than the first ratio of the maximum gain, not issuing the first warning or the second warning. The second ratio exceeds the first ratio. The first warning and the second warning are different.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It should be understood that, in the description herein and throughout the claims that follow, although the terms "first," "second," etc. may be configured to describe various elements, these elements should not be limited by these terms. These terms are only configured to distinguish one element from another. For example, a first element could be termed a second element, and, similarly, a second element could be termed a first element, without departing from the scope of the embodiments.

It should be understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

Figure 1:
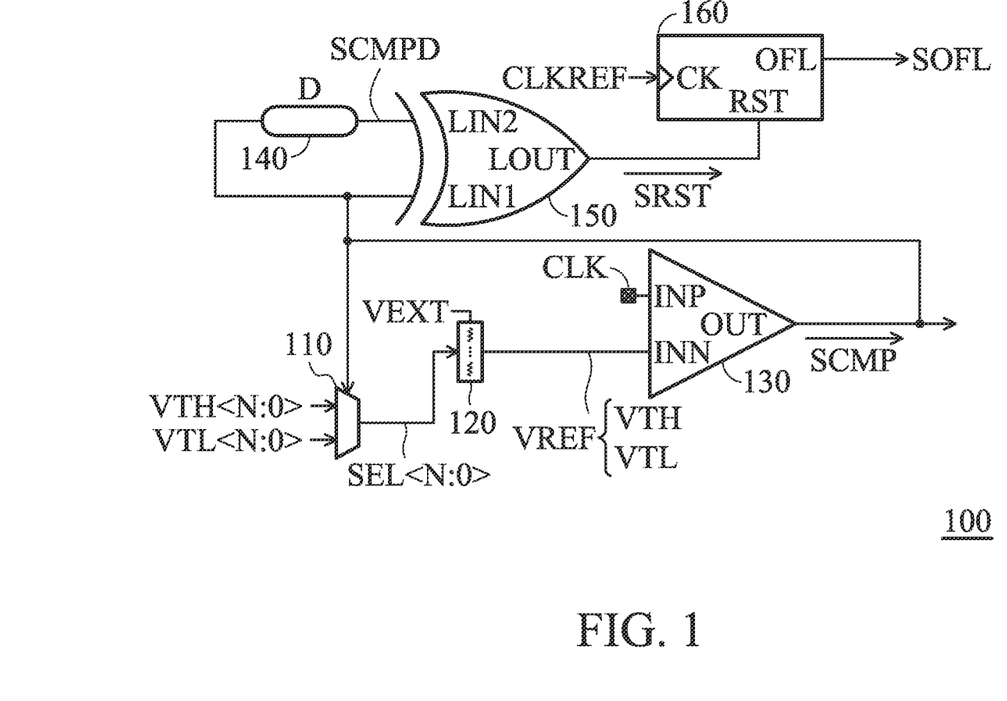
FIG. 1 is a schematic diagram of a detection circuit in accordance with an embodiment of the invention.

FIG. 1 is a schematic diagram of a detection circuit in accordance with an embodiment of the invention As shown in FIG. 1, the detection circuit 100 includes a multiplexer 110, a digital-to-analog converter 120, and a comparator 130. The multiplexer 110 outputs either the first signal VTL<N:0> or the second signal VTH<N:0> as the selection signal SEL<N:0> according to the voltage level of the comparison signal SCMP. According to an embodiment of the invention, the first signal VTL<N:0>, the second signal VTH<N:0>, and the selection signal SEL<N:0> are digital signals. In other words, the first signal VTL<N:0>, the second signal VTH<N:0>, and the selection signal SEL<N:0> are all (N+1)-bit digital signals, where N is arbitrary positive integer.

The digital-to-analog converter 120 outputs the reference voltage VREF according to the selection signal SEL<N:0> and the external voltage VEXT. The comparator 130 is configured to compare the clock signal CLK to the reference voltage VREF to generate a comparison signal SCMP. As shown in FIG. 1, the comparator 130 includes a first input terminal INP, a second input terminal INN, and an output terminal OUT. The first input terminal INP receives the clock signal CLK, the second input terminal INN receives the reference voltage VREF, and the output terminal OUT outputs the comparison signal SCMP.

According to an embodiment of the invention, when the clock signal CLK exceeds the reference voltage VREF, the comparison signal SCMP from the output terminal OUT is at the first voltage level, so that the multiplexer 110 outputs the first signal VTL<N:0> as the selection signal SEL<N:0> according to the first voltage level signal SCMP. The digital-to-analog converter 120 generates the reference voltage VREF, which is at the low threshold voltage VTL, according to the external voltage VEXT and the first signal VTL<N:0>.

According to another embodiment of the invention, when the clock signal CLK does not exceed the reference voltage VREF, the comparison signal SCMP from the output terminal OUT is at the second voltage level, so that the multiplexer 110 outputs the second signal VTH<N:0> as the selection signal SEL<N:0> according to the second voltage level. The digital-to-analog converter 120 generates the reference voltage VREF, which is at the high threshold voltage VTH, according to the external voltage VEXT and the second signal VTH<N:0>.

According to an embodiment of the invention, the first voltage level is the high voltage level, the second voltage level is the low voltage level, and the high threshold voltage VTH exceeds the low threshold voltage VTL. According to an embodiment of the invention, the purpose of adjusting the hysteresis of the detection circuit 100 can be achieved by adjusting the first signal VTL<N:0> and the second signal VTH<N:0>.

Figure 2:
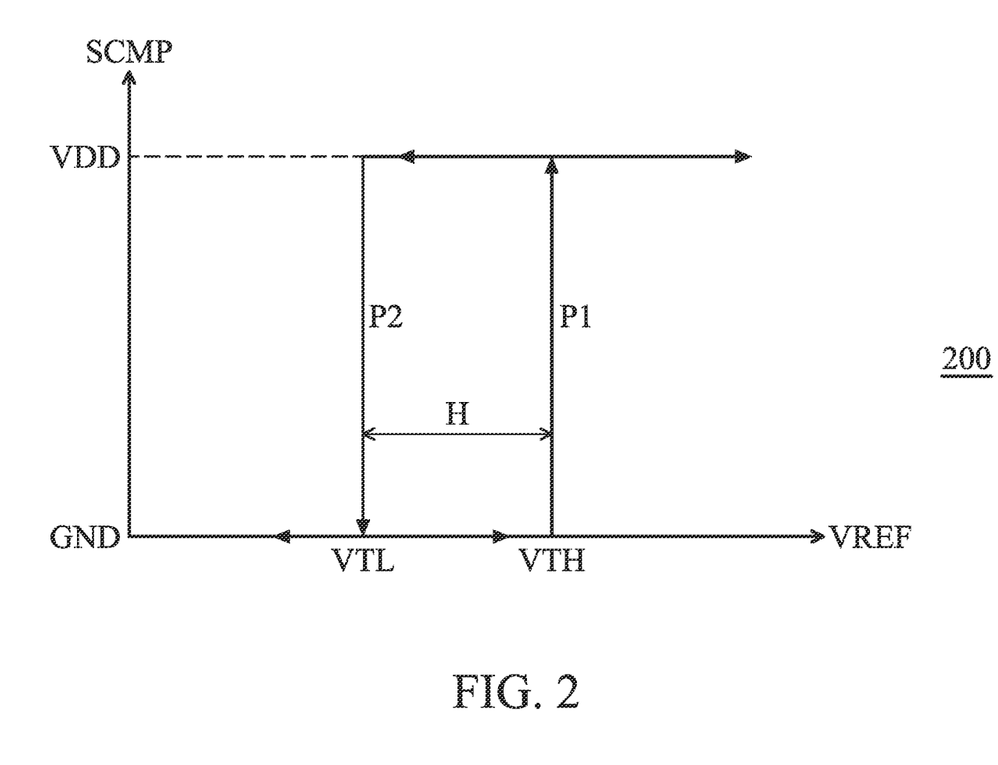
FIG. 2 is a schematic diagram of a hysteresis curve of a comparator in accordance with an embodiment of the invention.

FIG. 2 is a schematic diagram of a hysteresis curve of a comparator in accordance with an embodiment of the invention. As shown in FIG. 2, the vertical axis of the hysteresis curve 200 is the comparison signal SCMP. The highest level of the comparison signal SCMP is the supply voltage VDD, and the lowest level is the ground GND. The horizontal axis of the hysteresis curve 200 is the reference voltage VREF, in which the supply voltage VDD and the ground GND are supplied to the comparator 130.

According to an embodiment of the invention, when the comparison signal SCMP from the comparator 130 in FIG. 1 is at a low voltage level (i.e., the ground GND or the second voltage level), the multiplexer 110 provides the second signal VTH<N:0> to the digital-to-analog converter 120 according to the comparison signal SCMP, so that the reference voltage VREF generated by the digital-to-analog converter 120 is at the high threshold voltage VTH. Therefore, when the clock signal CLK exceeds the high threshold voltage VTH, the comparison signal SCMP is converted from the low voltage level (i.e., the ground GND or the second voltage level) to the high voltage (i.e., the supply voltage VDD or the first voltage level) along the first path P1 in FIG. 2.

According to another embodiment of the invention, when the comparison signal SCMP from the comparator 130 in FIG. 1 is at a high voltage level (i.e., the supply voltage VDD or the first voltage level), the multiplexer 110 provides the first signal VTL<N:0> to the digital-to-analog converter 120 according to the comparison signal SCMP, so that the reference voltage VREF generated by the digital-to-analog converter 120 is at the low threshold voltage VTL. Therefore, when the clock signal CLK is lower than the low threshold voltage VTL, the comparison signal SCMP is converted from the high voltage level (i.e., the supply voltage VDD or the first voltage level) to the low voltage level (i.e., the ground GND or the second voltage level) along the second path P2 in FIG. 2.

In other words, as shown in FIG. 2, the threshold voltage that the comparison signal SCMP is converted from a high voltage level (i.e., the supply voltage VDD or the first voltage level) to a low voltage level (i.e., the ground GND or the second voltage level) is different than that the comparison signal SCMP is converted from the low voltage level (i.e., the ground GND or the second voltage level) to the high voltage level (i.e., the supply voltage VDD or the first voltage level). The difference between the high threshold voltage VTH and the low threshold voltage VTL is defined as the hysteresis H.

Figure 3:
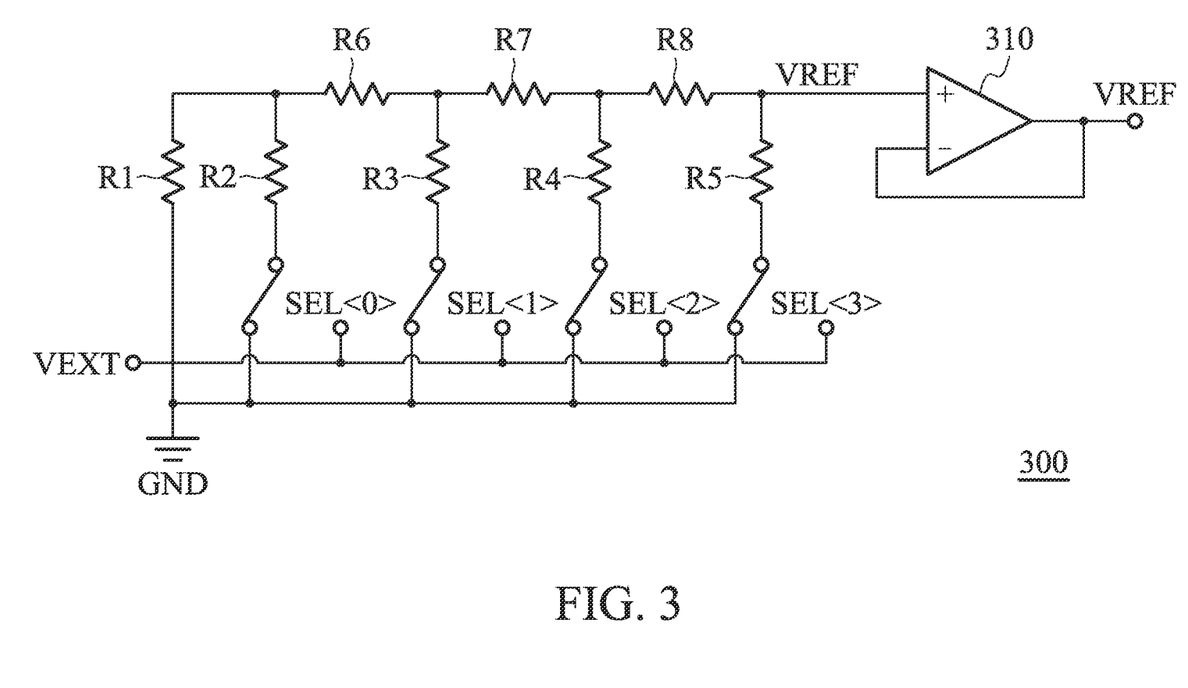
FIG. 3 is a schematic diagram of a digital-to-analog converter in accordance with an embodiment of the invention.

FIG. 3 is a schematic diagram of a digital-to-analog converter in accordance with an embodiment of the invention, wherein the digital-to-analog converter 300 corresponds to the digital-to-analog converter 120 in FIG. 1. In addition, the digital-to-analog converter 300 in FIG. 3 is merely illustrated as 4-bit for explanation but not intended to be limited thereto. As shown in FIG. 3, the digital-to-analog converter 300 includes a first resistor R1, a second resistor R2, a third resistor R3, a fourth resistor R4, a fifth resistor R5, a sixth resistor R6, a seventh resistor R7, an eighth resistor R8, and an unity gain amplifier 310.

As shown in FIG. 3, the first resistor R1, the second resistor R2, the third resistor R3, the fourth resistor R4, and the fifth resistor R5 have the identical first resistance value, and the sixth resistor R6, the seventh resistor R7, and the eighth resistor R8 have the identical second resistance value, in which the first resistance value is twice of the second resistance value. The 4-bit selection signal SEL<3:0> is configured to respectively switch the second resistor R2, the third resistor R3, the fourth resistor R4, and the fifth resistor R5 between the external voltage VEXT and the ground GND to generate the reference voltage VREF between the fifth resistor R5 and the eighth resistor R8.

The positive input terminal of the unity gain amplifier 310 receives the reference voltage VREF, and the negative input terminal and the output terminal of the unity gain amplifier 310 are electrically connected to each other to form a unity gain amplifier. In other words, the output terminal of the unity gain amplifier 310 outputs the reference voltage VREF, and the unity gain amplifier 310 is configured to improve the current driving capability of the reference voltage VREF.

According to an embodiment of the invention, the second resistor R2, the third resistor R3, the fourth resistor R4, and the fifth resistor R5 are switched between the external voltage VEXT and the ground GND by using the selection signal SEL<3:0> to generate different voltage division ratios between the fifth resistor R5 and the eighth resistor R8. The reference voltage VREF is then generated by the different voltage division ratios with the external voltage VEXT.

Figure 4:
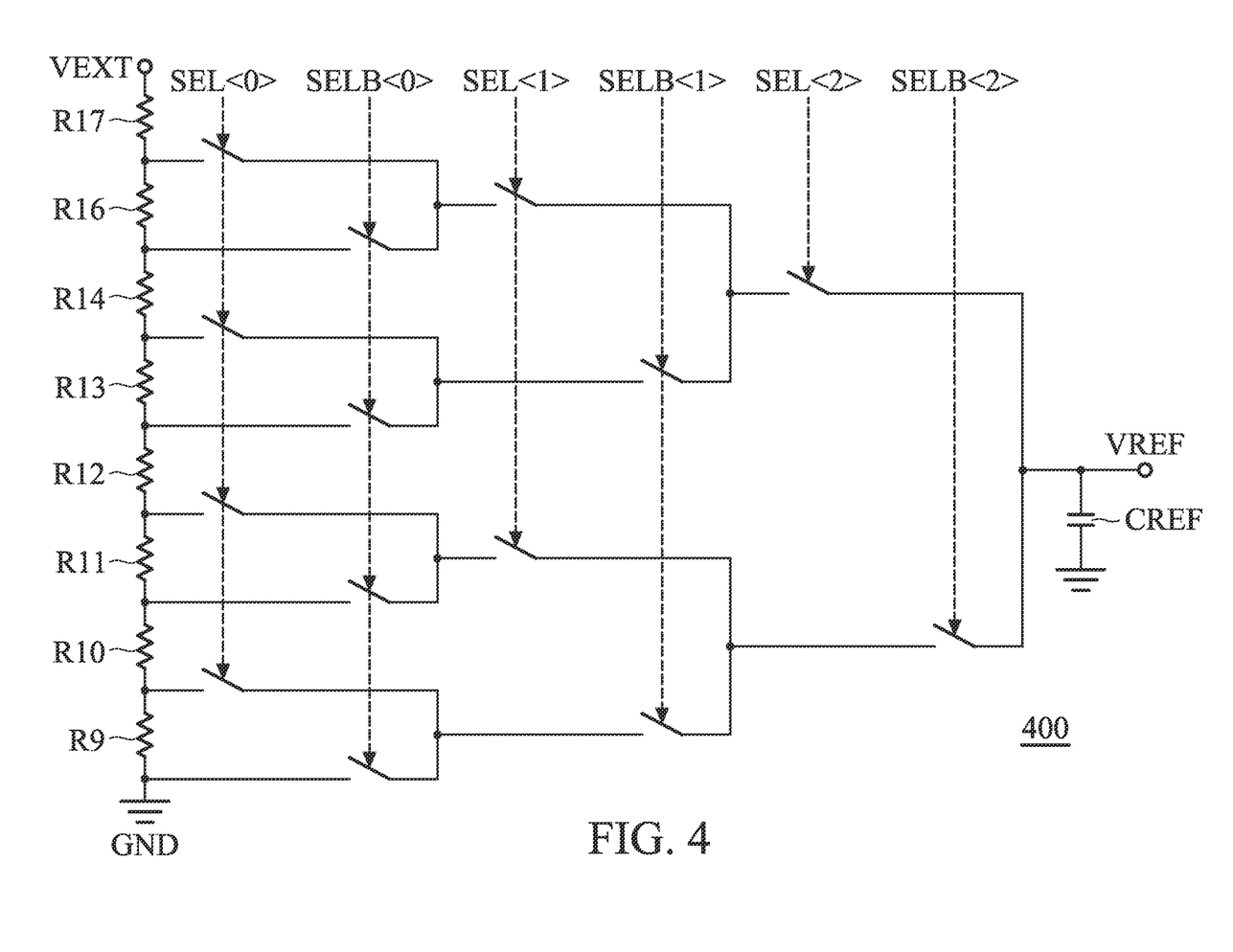
FIG. 4 is a schematic diagram of a digital-to-analog converter in accordance with another embodiment of the invention.

FIG. 4 is a schematic diagram of a digital-to-analog converter in accordance with another embodiment of the invention, in which the digital-to-analog converter 400 corresponds to the digital-to-analog converter 120 in FIG. 1. In addition, the digital-to-analog converter 400 in FIG. 4 is merely illustrated as 3-bit for explanation, but not intended to be limited thereto. As shown in FIG. 4, the digital-to-analog converter 400 includes a ninth resistor R9, a tenth resistor R10, an eleventh resistor R11, a twelfth resistor R12 the thirteenth resistor R13, the fourteenth resistor R14, the fifteenth resistor R15, the sixteenth resistor R16, and the seventeenth resistor R17 connected in series between the external voltage VEXT and the ground GND and having the same resistance value, which are configured to divide the voltage difference between the external voltage VEXT and the ground GND into 9 equal parts.

The selection signal SEL<2:0> and the inverted selection signal SELB<2:0> are configured to select an appropriate voltage as the reference voltage VREF, in which the inverted selection signal SELB<2:0> is an inverse of the selection signal SEL<2:0>. In addition, the digital-to-analog converter 400 further includes a reference capacitor CREF, where the reference capacitor CREF is electrically connected between the reference voltage VREF and the ground GND to stabilize the reference voltage VREF. In other words, the digital-to-analog converter 400 selects different voltage division ratios based on different selection signals SEL<2:0> and different inverted selection signals SELB<2:0> to generate different reference voltage VREF in combination with the external voltage VEXT, where the reference voltage VREF is the product of the external voltage VEXT and the selected voltage division ratio.

Referring to FIG. 1, the detection circuit 100 further includes a delay circuit 140, an exclusive-OR gate 150, and a counter 160. The delay circuit 140 is configured to provide a delay time D for generating a delayed comparison signal SCMPD according to the comparison signal SCMP and the delay time D. According to an embodiment of the invention, the delayed comparison signal SCMPD is delayed by the delay time D compared to the comparison signal SCMP.

The exclusive-OR gate 150 includes a first logic input terminal LIN1, a second logic input terminal LIN2, and a logic output terminal LOUT. The first logic input terminal LIN1 receives the comparison signal SCMP, the second logic input terminal LIN2 receives the delayed comparison signal SCMPD, and the logic output terminal LOUT generates a reset signal SRST.

According to an embodiment of the invention, when the comparison signal SCMP is converted from the high voltage level to the low voltage level or from the low voltage level to the high voltage level, the delay circuit 140 provides a delay time D, which delays the comparison signal SCMPD changed later than the comparison signal SCMP. Therefore, when the exclusive-OR gate 150 receives the comparison signal SCMP and the delayed comparison signal SCMPD, which are respectively at the high voltage level and the low voltage level, the reset signal SRST from the exclusive-OR gate 150 is at the high voltage level.

According to another embodiment of the invention, when the comparison signal SCMP is maintained at the high voltage level transition or the low voltage level, although the delay circuit 140 provides a delay time D, the delay comparison signal SCMPD and the comparison signal SCMP are both at the high voltage level or the low voltage level. Therefore, when the exclusive-OR gate 150 receives the comparison signal SCMP and the delayed comparison signal SCMPD, which are both at the high voltage level or the low voltage level, the reset signal SRST from the exclusive-OR gate 150 is at the low voltage level.

The counter 160 includes a clock terminal CK, a reset terminal RST, and an overflow terminal OFL. The clock terminal CK receives the reference clock signal CLKREF, the reset terminal RST receives the reset signal SRST, and the overflow terminal OFL generates an overflow signal SOFL. The counter 160 is configured to count the number of pulses of the reference clock signal CLKREF to generate the overflow signal SOFL, and the counter 160 resets the overflow signal SOFL according to the reset signal SRST. According to an embodiment of the invention, the overflow signal SOFL that is generated by the counter 160 counting the number of pulses of the reference clock signal CLKREF is at the high voltage level, and the overflow signal SOFL that is reset by the reset signal SRST is at a low voltage level. According to an embodiment of the invention, the reference clock signal CLKREF is provided externally.

Figure 5:
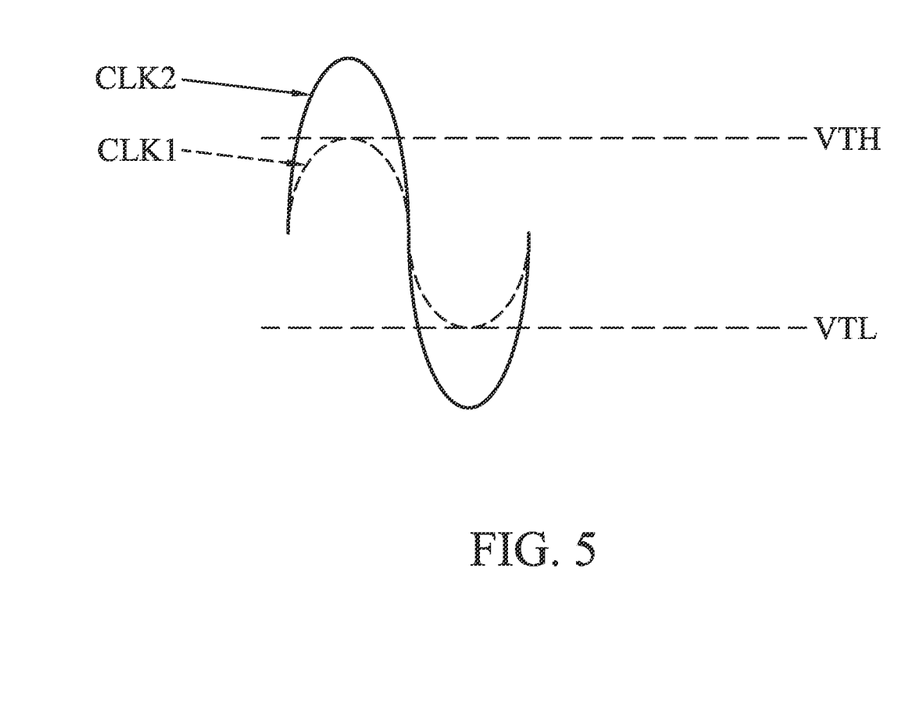
FIG. 5 is a waveform diagram of a clock signal in accordance with an embodiment of the invention.

FIG. 5 is a waveform diagram of a clock signal in accordance with an embodiment of the invention. As shown in FIG. 5, the peak-to-peak amplitude of the first clock signal CLK1 is within the range of the high threshold voltage VTH and the low threshold voltage VTL, and the peak-to-peak amplitude of the second clock signal CLK2 is outside of the range of the threshold voltage VTH and the low threshold voltage VTL.

According to an embodiment of the invention, when the clock signal CLK in FIG. 1 is the first clock signal CLK1 in FIG. 5, the comparison signal SCMP is maintained at the high voltage level or the low voltage level and the reset signal SRST from the exclusive-OR gate 150 is at the low voltage level, so that the counter 160 counts the number of pulses of the reference clock CLKREF to generate the overflow signal SOFL at the high voltage level.

According to another embodiment of the invention, when the clock signal CLK in FIG. 1 is the second clock signal CLK2 in FIG. 5, the comparison signal SCMP is switched between the high voltage level and the low voltage level and the reset signal SRST from the exclusive-OR gate 150 is at the high voltage level, so that the overflow signal SOFL from the counter 160 is reset to the low voltage level according to the reset signal SRST. In addition, since the comparison signal SCMP is switched between the high voltage level and the low voltage level, the reset signal SRST is also switched between the high voltage level and the low voltage level.

As stated above, the overflow signal SOFL can be configured to determine the relationship between the peak-to-peak amplitude of the clock signal CLK, the high threshold voltage VTH, and the low threshold voltage VTL, and it is then determined whether the peak-to-peak amplitude of the clock signal CLK is large enough. The low threshold voltage VTL and the high threshold voltage VTH can be adjusted through the first signal VTL<N:0> and the second signal VTH<N:0> respectively.

Figure 6:
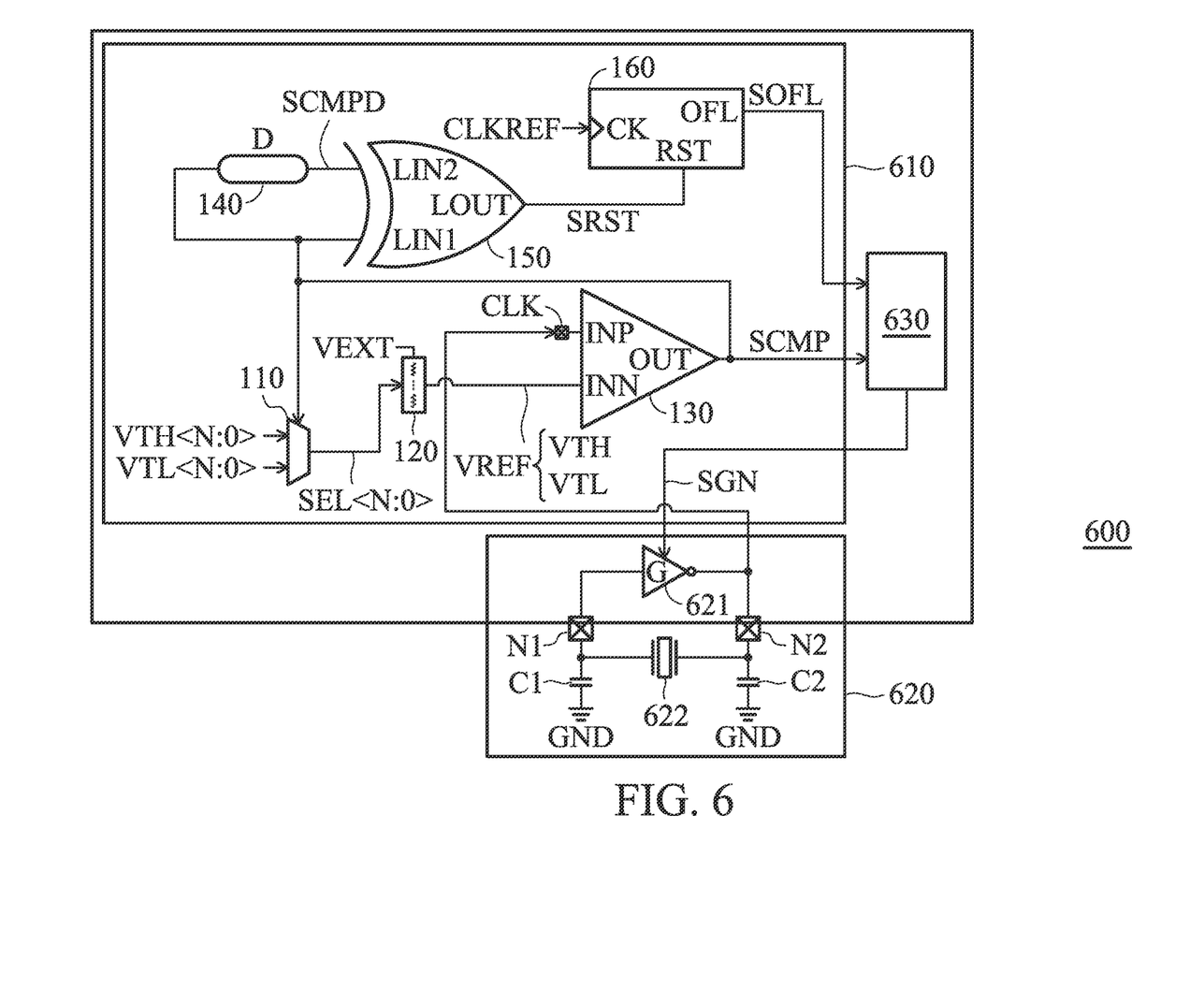
FIG. 6 is a schematic diagram of an electronic circuit in accordance with an embodiment of the invention.

FIG. 6 is a schematic diagram of an electronic circuit in accordance with an embodiment of the invention. As shown in FIG. 6, the electronic circuit 600 includes a detection circuit 610, an oscillation circuit 620, and a controller 630. The detection circuit 610 corresponds to the detection circuit 100 in FIG. 1, which will not be repeated herein.

The oscillation circuit 620 includes an amplifier 621, a quartz crystal 622, a first capacitor C1, and a second capacitor C2. The amplifier 621 is configured to amplify the signal of the first node N1 by a gain G, and then generates a clock signal CLK at the second node N2. The amplifier 621 further generates a gain G according to the gain signal SGN.

The quartz crystal 622 is electrically connected between the first node N1 and the second node N2, the first capacitor C1 is electrically connected between the first node N1 and the ground GND, and the second capacitor C2 is electrically connected between the second node N2 and the ground GND. In other words, the oscillation circuit 620 generates the clock signal CLK at the second node N2, and increases or decreases the peak-to-peak amplitude of the clock signal CLK by using the gain G of the amplifier 621.

The controller 630 receives the overflow signal SOFL and the comparison signal SCMP, and determines whether the peak-to-peak amplitude of the clock signal CLK is sufficiently large according to the overflow signal SOFL. In addition, the controller 630 further adjusts the gain G of the amplifier 621 through the gain signal SGN, thereby adjusting the peak-to-peak amplitude of the clock signal CLK. According to an embodiment of the invention, the controller 630 can adjust the low threshold voltage VTL and the high threshold voltage VTH through the first signal VTL<N:0> and the second signal VTH<N:0> respectively.

According to an embodiment of the invention, when the clock signal CLK is the first clock signal CLK1 in FIG. 5, the comparison signal SCMP is at the high voltage level or the low voltage level, so that the output reset signal SRST from the exclusive-OR gate 150 is at the low voltage level. Therefore, the overflow signal SOFL generated by the counter 160 counting the number of pulses of the reference clock signal CLKREF is at the high voltage level. When the controller 630 determines that the peak-to-peak amplitude of the clock signal CLK is not large enough and the peak-to-peak amplitude of the clock signal CLK is within the range between the high threshold voltage VTH and the low threshold voltage VTL based on the overflow signal SOFL being at the high voltage level, the controller 630 utilizes the gain signal SGN to increase the gain G of the amplifier 621.

According to another embodiment of the invention, when the clock signal CLK is the second clock signal CLK2 in FIG. 5, the comparison signal SCMP is switched between the high voltage level and the low voltage level, so that the reset signal SRST from the exclusive-OR gate 150 is also switched between the high voltage level and the low voltage level, and then the overflow signal SOFL of the counter 160 is periodically reset to the low voltage level. When the controller 630 determines that the peak-to-peak amplitude of the clock signal CLK is large enough to be outside the range of the high threshold voltage VTH and the low threshold voltage VTL based on the overflow signal SOFL which is the low voltage level, the controller 630 maintains the gain G of the amplifier 621 to make the oscillation circuit 620 continuously output the clock signal CLK with the same peak-to-peak amplitude.

As illustrated above, the overflow signal SOFL is reset to the low voltage level and the overflow signal SOFL is at the high voltage level when the counter 160 overflows, but not intended to be limited thereto. In other words, the counter 160 can reset the overflow signal SOFL to the high voltage level according to the reset signal SRST. When the counter 160 counts the number of pulses of the reference clock signal CLKREF and overflow occurs, the overflow signal SOFL is at the low voltage level.

As shown in FIG. 6, the gain G of the amplifier 621 has the maximum gain. According to an embodiment of the invention, when the gain G is between the first ratio and the second ratio of the maximum gain, the controller 630 issues a first warning. According to another embodiment of the invention, when the gain G exceeds the second ratio of the maximum gain, the controller G issues a second warning. According to another embodiment of the invention, when the gain G is less than the first ratio of the maximum gain, the controller 630 does not issue any warning. According to some embodiments of the invention, the second ratio exceeds the first ratio, and the first warning is different from the second warning.

For example, when the gain G of the amplifier 621 is less than 50% of the maximum gain, the controller 630 does not issue any warning. When the gain G of the amplifier 621 exceeds 50% of the maximum gain and is less than 75% of the maximum gain, the controller 630 issues a minor warning to notify the user that the oscillation circuit 620 has aged. When the gain G of the amplifier 621 exceeds 75% of the maximum gain and is less than 90% of the maximum gain, the controller 630 issues a medium warning to warn the user that the oscillation circuit 620 has seriously aged, that the quartz crystal 622 should be replaced as soon as possible, and whether the system operates normally should be paid attention to at all times. When the gain G of the amplifier 621 exceeds 90% of the maximum gain, the controller 630 issues a strong warning to warn the user that the oscillation circuit 620 will stop operating at any time, and the quartz crystal 622 should be replaced immediately. The above example is illustrated for explanation, but not intended to be limited thereto.

According to an embodiment of the invention, the detection circuit 610, the amplifier 621 of the oscillation circuit 620, and the controller 630 are deposited in a microprocessor. In other words, the detection circuit 610, the amplifier 621 of the oscillation circuit 620, and the controller 630 are deposited in the same package or on the same die, which are connected to the quartz crystal 622, the capacitor C1, and the second capacitor C2 through the first node N1 and the second node N2.

Figure 7:
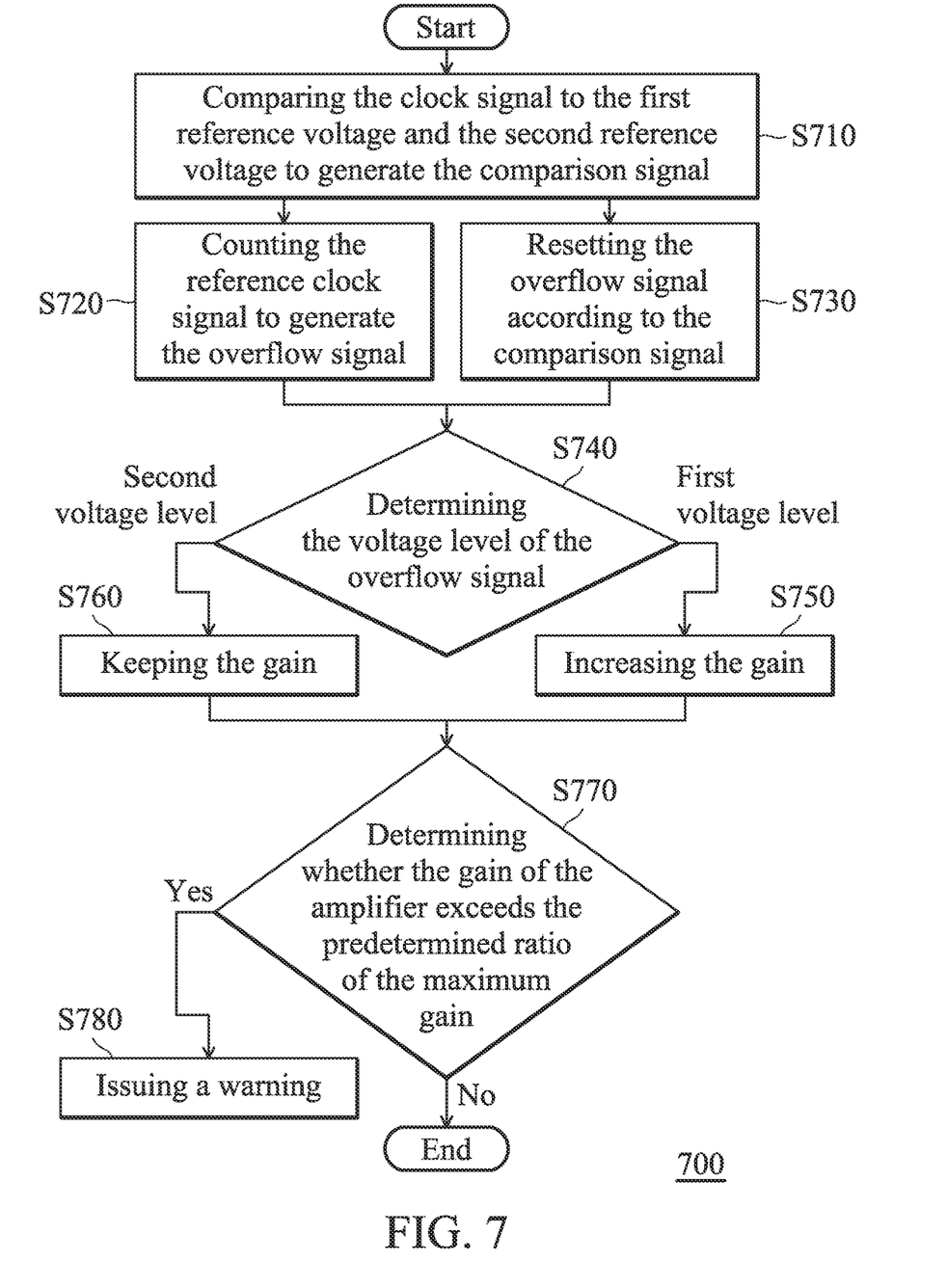
FIG. 7 is a flow chart of a detection method in accordance with an embodiment of the invention.

FIG. 7 is a flow chart of a detection method in accordance with an embodiment of the invention. The following description of the flowchart 700 will be combined with the electronic circuit 600 in FIG. 6 for detailed description.

As shown in FIG. 7, the comparator 130 is configured to compare the clock signal CLK to the first reference voltage (corresponding to the low threshold voltage VTL in FIG. 6) and the second reference voltage (corresponding to the high threshold voltage VTH in FIG. 6) to generate the comparison signal SCMP (Step S710). Next, the counter 160 is configured to count the number of pulses of the reference clock signal CLKREF to generate the overflow signal SOFL (Step S720), and/or the overflow signal SOFL is reset according to the comparison signal SCMP (Step S730). As shown in FIG. 6, the delay circuit 140 and the exclusive-OR gate 150 generate the reset signal SRST according to the comparison signal SCMP to reset the overflow signal SOFL.

Subsequently, the controller 630 determines the voltage level of the overflow signal SOFL (Step S740). According to an embodiment of the invention, the overflow signal SOFL generated by the counter 160 counting the number of pulses of the reference clock signal CLKREF is at the high voltage level (corresponding to the first voltage level), and the counter 160 resets the overflow signal SOFL to the low voltage level (corresponding to the second voltage level) according to the reset signal SRST. According to another embodiment of the invention, the overflow signal SOFL generated by the counter 160 counting the number of pulses of the reference clock signal CLKREF is at the low voltage level (corresponding to the first voltage level), and the counter 160 resets the overflow signal SOFL to the high voltage level (corresponding to the second voltage level) according to the reset signal SRST.

After Step S740, when the overflow signal SOFL is at the first voltage level, it indicates that the counter 160 has overflowed and the peak-to-peak amplitude of the clock signal CLK is within the range of the first reference voltage and the second reference voltage. Therefore, the controller 630 increases the gain G of the amplifier 621 (Step S750). When the overflow signal SOFL is at the second voltage level, it indicates that the peak-to-peak amplitude of the clock signal CLK is outside the range of the first reference voltage and the second reference voltage, so the controller 630 maintains the gain G of the amplifier 621 (Step S760), thereby maintaining the peak-to-peak amplitude of the clock signal CLK.

After Step S750 and Step S760, the controller 630 is configured to determine whether the gain G of the amplifier 621 exceeds the predetermined ratio of the maximum gain (Step S770). When it is determined that the gain G exceeds the predetermined ratio of the maximum gain, the controller 630 issues a warning (Step S780) to warn the user.

For example, when the gain G of the amplifier 621 is less than 50% of the maximum gain, the controller 630 does not issue any warning. When the gain G of the amplifier 621 exceeds 50% of the maximum gain and is less than 75% of the maximum gain, the controller 630 issues a minor warning to notify the user that the oscillation circuit 620 has aged. When the gain of the amplifier 621 exceeds 75% of the maximum gain and is less than 90% of the maximum gain, the controller 630 issues a medium warning to warn the user that the oscillation circuit 620 has seriously aged, that the quartz crystal 622 should be replaced as soon as possible, and whether the system operates normally should be paid attention to at all times. When the gain of the amplifier 621 exceeds 90% of the maximum gain, the controller 630 issues a strong warning to warn the user that the oscillation circuit 620 will stop operating at any time, and the quartz crystal 622 should be replaced immediately. The above example is merely illustrated for explanation, but not intended to be limited thereto.

The invention proposes a detection circuit for detecting the peak-to-peak amplitude of the clock signal, which is configured to detect whether the peak-to-peak amplitude of the clock signal is large enough. The invention further provides an electronic circuit and a detection method for detecting whether the peak-to-peak amplitude of the clock signal is sufficiently large. When it is determined that the peak-to-peak amplitude of the clock signal is not large enough, the gain of the amplifier of the oscillation circuit is increased to increase the peak-to-peak amplitude of the clock signal. The invention further issues a warning according to the gain of the amplifier of the oscillation circuit to inform the user that the quartz crystal should be replaced as soon as possible to maintain the normal operation of the system.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A detection circuit for detecting a clock signal, comprising:
   a multiplexer, outputting either a first signal or a second signal as a selection signal according to a comparison signal;
   a digital-to-analog converter, outputting a reference voltage according to the selection signal;
   a comparator, comparing the clock signal to the reference voltage to generate the comparison signal; and
   a counter, counting a number of pulses of a reference clock signal to generate an overflow signal and resetting the overflow signal according to the comparison signal, wherein the overflow signal indicates amplitude of the clock signal.

2. The detection circuit as defined in claim 1, wherein the digital-to-analog converter receives an external voltage and the digital-to-analog converter generates a first reference voltage according to the first signal and the external voltage, wherein the digital-to-analog converter generates a second reference voltage according to the second signal and the external voltage, wherein the first reference voltage is lower than the second reference voltage.

3. The detection circuit as defined in claim 2, wherein when peak-to-peak amplitude of the clock signal is outside the first reference voltage and the second reference voltage, the comparison signal is switched between a first voltage level and a second voltage level, and the counter periodically resets the overflow signal according to the comparison signal.

4. The detection circuit as defined in claim 2, wherein when peak-to-peak amplitude of the clock signal is between the first reference voltage and the second reference voltage, the comparison signal is at a second voltage level, and the counter counts the number of pulses of the reference clock signal to generate the overflow signal.

5. The detection circuit as defined in claim 1, further comprising:
   a delay circuit, generating a delay comparison signal according to the comparison signal and a delay time, wherein the delay comparison signal is delayed by the delay time compared to the comparison signal; and
   an exclusive-OR gate, comprising a first logic input terminal, a second logic input terminal, and a logic output terminal, wherein the first logic input terminal receives the comparison signal, the second logic input terminal receives the delay comparison signal, and the logic output terminal generates a reset signal, wherein the counter resets the overflow signal based on the reset signal.

6. The detection circuit as defined in claim 5, wherein when the comparison signal is converted from a first voltage level to a second voltage level or from the second voltage level to the first voltage level, the reset signal generated by the exclusive-OR gate resets the overflow signal, wherein when the comparison signal is at the first voltage level or the second voltage level, the reset signal generated by the exclusive-OR gate does not reset the overflow signal.

7. The detection circuit as defined in claim 1, wherein the comparator comprises:
   a first input terminal, receiving the input voltage;
   a second input terminal, receiving the reference voltage; and
   an output terminal, wherein when the input voltage exceeds the reference voltage, the output terminal outputs a first voltage level to serve as the comparison signal, wherein when the input voltage does not exceed the reference voltage, the output terminal outputs a second voltage level to serve as the comparison signal.

8. The detection circuit as defined in claim 7, wherein when the output terminal outputs the first voltage level, the multiplexer provides the first signal to the digital-to-analog converter, wherein when the output terminal outputs the second voltage level, the multiplexer provides the second signal to the digital-to-analog converter.

9. An electronic circuit, comprising:
   a detection circuit, comprising:
      a multiplexer, outputting the first signal or the second signal as a selection signal according to a comparison signal;
      a digital-to-analog converter, outputting a reference voltage according to the selection signal;
      a comparator, comparing the clock signal to the reference voltage to generate the comparison signal; and
      a counter, counting a number of pulses of a reference clock signal to generate an overflow signal and resetting the overflow signal according to the comparison signal, wherein the overflow signal indicates amplitude of the clock signal;
   an oscillation circuit, generating the clock signal and comprising:
      an amplifier, amplifying a signal of a first node with a gain to generate the clock signal at a second node and generating the gain according to a gain signal; and
      a quartz crystal, electrically connected between the first node and the second node; and
   a controller, generating the gain signal according to the overflow signal.

10. The electronic circuit as defined in claim 9, wherein when the overflow signal is at a first voltage level, the controller maintains the gain according to the gain signal, wherein when the overflow signal is at a second voltage level, the controller increases the gain according to the gain signal.

11. The electronic circuit as defined in claim 10, wherein the digital-to-analog converter receives an external voltage and the digital-to-analog converter generates a first reference voltage according to the first signal and the external voltage, wherein the digital-to-analog converter generates a second reference voltage according to the second signal and the external voltage, wherein the first reference voltage is lower than the second reference voltage.

12. The electronic circuit as defined in claim 11, wherein when peak-to-peak amplitude of the clock signal is outside the range of the first reference voltage and the second reference voltage, the comparison signal is switched between a first voltage level and a second voltage level, and the counter periodically resets the overflow signal according to the comparison signal, wherein when the peak-to-peak amplitude of the clock signal is within the range of the first reference voltage and the second reference voltage, the comparison signal is at the second voltage level, and the counter counts the number of pulses of the reference clock signal to generate the overflow signal.

13. The electronic circuit as defined in claim 9, wherein the detection circuit further comprises:
   a delay circuit, generating a delay comparison signal according to the comparison signal and a delay time, wherein the delay comparison signal is delayed by the delay time compared to the comparison signal; and
   an exclusive-OR gate, comprising a first logic input terminal, a second logic input terminal, and a logic output terminal, wherein the first logic input terminal receives the comparison signal, the second logic input terminal receives the delay comparison signal, and the logic output terminal generates a reset signal, wherein the counter resets the overflow signal based on the reset signal.

14. The electronic circuit as defined in claim 13, wherein when the comparison signal is converted from a first voltage level to a second voltage level or from the second voltage level to the first voltage level, the reset signal generated by the exclusive-OR gate resets the overflow signal, wherein when the comparison signal is at the first voltage level or the second voltage level, the reset signal generated by the exclusive-OR gate does not reset the overflow signal.

15. The electronic circuit as defined in claim 9, wherein the comparator comprises:
   a first input terminal, receiving the input voltage;
   a second input terminal, receiving the reference voltage; and an output terminal, wherein when the input voltage exceeds the reference voltage, the output terminal outputs a first voltage level to serve as the comparison signal, wherein when the input voltage does not exceed the reference voltage, the output terminal outputs a second voltage level to serve as the comparison signal.

16. The electronic circuit as defined in claim 15, wherein when the output terminal outputs the first voltage level, the multiplexer provides the first signal to the digital-to-analog converter, wherein when the output terminal outputs the second voltage level, the multiplexer provides the second signal to the digital-to-analog converter.

17. The electronic circuit as defined in claim 9, wherein the gain of the amplifier has a maximum gain, wherein when the gain is between a first ratio and a second ratio of the maximum gain, the controller issues a first warning, wherein when the gain exceeds the second ratio of the maximum gain, the controller issues a second warning, wherein when the gain is less than the first ratio of the maximum gain, the controller does not issue the first warning or the second warning, wherein the second ratio exceeds the first ratio, and the first warning and the second warning are different.

18. A detection method for detecting a clock signal generated by an oscillation circuit, wherein the oscillation circuit comprises an amplifier having a gain, wherein the detection method comprises:
  comparing the clock signal to a first reference voltage and a second reference voltage to generate a comparison signal;
  by using a counter, counting a number of pulses of a reference clock signal to generate an overflow signal;
  when the clock signal oscillates outside the range of the first reference voltage and the second reference voltage, resetting the overflow signal to be a second voltage level via the comparison signal; and
  adjusting the gain according to the overflow signal.

19. The detection method as defined in claim 18, further comprising:
  when the clock signal oscillates between the first reference voltage and the second reference voltage, counting the number of pulses of the reference clock signal with the counter to generate the overflow signal at a first voltage level;
  when the overflow signal is at the first voltage level, increasing the gain; and
  when the overflow signal is at the second voltage level, maintaining the gain.

20. The detection method as defined in claim 18, wherein the gain has a maximum gain, wherein the detection method further comprises:
  when the gain is within a first ratio and a second ratio of the maximum gain, issuing a first warning;
  when the gain exceeds the second ratio of the maximum gain, issuing a second warning; and
  when the gain is less than the first ratio of the maximum gain, not issuing the first warning or the second warning, wherein the second ratio exceeds the first ratio, and the first warning and the second warning are different.

* * * * *